United States Patent
Kawaguchi et al.

(10) Patent No.: US 9,974,137 B2
(45) Date of Patent: May 15, 2018

(54) LIGHTING DEVICE AND LIGHT EMITTING DEVICE HAVING RED AND GREEN PHOSPHOR ARRANGED THEREIN

(71) Applicant: SHARP KABUSHIKI KAISHA, Sakai, Osaka (JP)

(72) Inventors: Yoshihiro Kawaguchi, Sakai (JP); Tomokazu Nada, Sakai (JP); Makoto Matsuda, Sakai (JP); Hiroaki Onuma, Sakai (JP); Osamu Jinushi, Sakai (JP); Toshio Hata, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days. days.

(21) Appl. No.: 15/532,920

(22) PCT Filed: Aug. 25, 2015

(86) PCT No.: PCT/JP2015/073810
§ 371 (c)(1),
(2) Date: Jun. 2, 2017

(87) PCT Pub. No.: WO2016/088412
PCT Pub. Date: Jun. 9, 2016

(65) Prior Publication Data
US 2017/0354010 A1    Dec. 7, 2017

(30) Foreign Application Priority Data

Dec. 5, 2014    (JP) .................................. 2014-247172

(51) Int. Cl.
*F21V 21/00*    (2006.01)
*H05B 33/08*    (2006.01)
(Continued)

(52) U.S. Cl.
CPC ..... *H05B 33/0857* (2013.01); *H05B 33/0821* (2013.01); *F21V 23/005* (2013.01); *F21Y 2113/10* (2016.08)

(58) Field of Classification Search
CPC ........................... F21V 23/005; F21Y 2113/10
(Continued)

(56) References Cited

U.S. PATENT DOCUMENTS 9,046,228 B2 *   6/2015   Tanaka ..................... B60Q 1/04
9,146,026 B2 *   9/2015   Funakubo ............... F21V 21/00
(Continued)

FOREIGN PATENT DOCUMENTS

JP    2001-93320    4/2001
JP    2005-100799    4/2005
(Continued)

OTHER PUBLICATIONS

International Search Report for PCT/JP2015/073810, dated Oct. 6, 2015, 2 pages.
(Continued)

*Primary Examiner* — Thuy Vinh Tran
(74) *Attorney, Agent, or Firm* — Nixon & Vanderhye P.C.

(57)    ABSTRACT

A light emitting device which can adjust color temperature as power is supplied from a single power source comprises an anode electrode land; a cathode electrode land; a first light emitting unit and a second light emitting unit; a low pass filter including a capacitance member which is provided in parallel with the first light emitting unit and the second light emitting unit; and a resistance member which is provided in series with the first light emitting unit and the second light emitting unit. A phosphor which is included in the first light emitting unit and the second light emitting unit includes a red phosphor which is excited by the primary light that is emitted from the LED element and emits light with a
(Continued)

peak light emission wavelength into a red region, and a green phosphor which is excited by the primary light that is emitted from the LED element and emits light with a peak light emission wavelength into a green region.

5 Claims, 14 Drawing Sheets

(51) Int. Cl.
*F21V 23/00* (2015.01)
*F21Y 113/10* (2016.01)

(58) Field of Classification Search
USPC .......... 362/230, 231, 249.01, 249.02; 257/89
See application file for complete search history.

(56) References Cited

U.S. PATENT DOCUMENTS

| | | | |
|---|---|---|---|
| 9,326,350 B2 * | 4/2016 | Chang | H01L 25/0753 |
| 2011/0285319 A1 | 11/2011 | Chao et al. | |
| 2012/0146079 A1 | 6/2012 | Baumann et al. | |
| 2012/0319565 A1 | 12/2012 | Sakuta et al. | |
| 2013/0215399 A1 | 8/2013 | Suzuki | |
| 2013/0241396 A1 | 9/2013 | Hiramatsu et al. | |
| 2013/0257266 A1 | 10/2013 | Ishizaki | |
| 2013/0285567 A1 * | 10/2013 | Kan | F21S 8/043 |
| | | | 315/192 |
| 2013/0320870 A1 * | 12/2013 | Oyaizu | F21K 9/1355 |
| | | | 315/192 |
| 2013/0328503 A1 | 12/2013 | Toda | |
| 2014/0133866 A1 * | 5/2014 | Liu | H05B 33/0818 |
| | | | 398/182 |
| 2014/0153238 A1 * | 6/2014 | Nishimura | H01L 25/0753 |
| | | | 362/237 |
| 2014/0232277 A1 | 8/2014 | Takahashi et al. | |

FOREIGN PATENT DOCUMENTS

| | | |
|---|---|---|
| JP | 2006-318773 | 11/2006 |
| JP | 2007-287617 | 11/2007 |
| JP | 2008-52994 | 3/2008 |
| JP | 2008-218504 | 9/2008 |
| JP | 2010-071264 A | 4/2010 |
| JP | 2010-170945 | 8/2010 |
| JP | 2011-71264 | 4/2011 |
| JP | 2011-249771 | 12/2011 |
| JP | 2012-060097 A | 3/2012 |
| JP | 2012-124356 | 6/2012 |
| JP | 2012-256572 | 12/2012 |
| JP | 2013-502711 A | 1/2013 |
| JP | 2013-172471 | 9/2013 |
| JP | 2013-189588 A | 9/2013 |
| JP | 2013-254669 | 12/2013 |
| JP | 2014-157744 | 8/2014 |

OTHER PUBLICATIONS

Written Opinion of the ISA for PCT/JP2015/073810, dated Oct. 6, 2015, 4 pages.

* cited by examiner

LIGHTING DEVICE AND LIGHT EMITTING DEVICE HAVING RED AND GREEN PHOSPHOR ARRANGED THEREIN

This application is the U.S. national phase of International Application No. PCT/JP2015/073810 filed 25 Aug. 2015, which designated the U.S. and claims priority to JP Patent Application No. 2014-247172 filed 5 Dec. 2014, the entire contents of each of which are hereby incorporated by reference.

TECHNICAL FIELD

The present invention relates to a light emitting device and a lighting device which can adjust color temperature.

BACKGROUND ART

Since light distribution of a halogen lamp is very similar to energy distribution of a blackbody, the halogen lamp shows excellent color rendering properties. Furthermore, color temperature of light emitted from the halogen lamp can be changed by controlling an amount of power supplied to the halogen lamp, and thus, the halogen lamp is used as a visible light source. However, there are problems that the temperature of the halogen lamp becomes extremely high since the halogen lamp emits infrared light, a reflector is required to prevent the infrared light from radiating, lifetime thereof is short compared with that of an LED, and there is much power consumption. Hence, a white light emitting device which uses light emitting diodes (LEDs) with small heat generation and longer lifetime is developed.

PTL 1 (Japanese Unexamined Patent Application Publication No. 2013-254669) discloses a color temperature variable illumination system, as a variable illuminance system capable of adjusting a color temperature and an illuminance of irradiated light in a well-balanced manner. The color temperature variable illumination system includes a light source unit having multiple types of light sources that emit light of colors different from each other, and a controller having a dial, which is rotatable, used to adjust the color temperature and the illuminance of light irradiated from the light source unit, in which the controller includes a memory which stores control curves in which the color temperature and the illuminance of light irradiated from the light source unit change in conjunction with each other; and an adjustment button used to adjust the control curves stored in the memory, and in which, when the dial is rotated, the color temperature and the illuminance of light irradiated from the light source unit change according to values determined by the control curves, respectively, which is adjusted by operating the adjustment button.

CITATION LIST

Patent Literature

PTL 1: Japanese Unexamined Patent Application Publication No. 2013-254669

SUMMARY OF INVENTION

Technical Problem

A technology of PTL 1 has a problem that a plurality of circuits are required to drive each lighting source and a structure of a light emitting device is complicated.

The present invention is devised to solve the aforementioned problems, and an object thereof is to provide a light emitting device that can adjust color temperature by using power supplied from a single power source, and a lighting device including the light emitting device.

Solution to Problem

[1] The present invention provides a light emitting device including an anode electrode land; a cathode electrode land; a first light emitting unit and a second light emitting unit which are electrically connected to the anode electrode land and the cathode electrode land, are adjacently provided in parallel with each other; and a low pass filter including a capacitance member which is provided in parallel with the first light emitting unit and the second light emitting unit, and a resistance member which is provided in series with the first light emitting unit and the second light emitting unit, in which electric resistance of the first light emitting unit is larger than electric resistance of the second light emitting unit, and in which color temperature of light which is emitted from an entire light emitting area including the first light emitting unit and the second light emitting unit is adjustable.

[2] In the light emitting device of the present invention, it is preferable that the resistance member be an inductor.

[3] In the light emitting device of the present invention, it is preferable that the light emitting device include the low pass filters with multiple stages.

[4] In the light emitting device of the present invention, it is preferable that the entire light emitting area including the first light emitting unit and the second light emitting unit be formed in a substantially rectangular shape in a planar view.

[5] The present invention provides a lighting device including the light emitting device described in any one of [1] to [4]; and a PWM signal type dimmer which is electrically connected to the light emitting device.

Advantageous Effects of Invention

According to the present invention, it is possible to provide a light emitting device which can adjust color temperature as power is supplied from a single power source, and a lighting device including the light emitting device.

DESCRIPTION OF EMBODIMENTS

Figure 1:
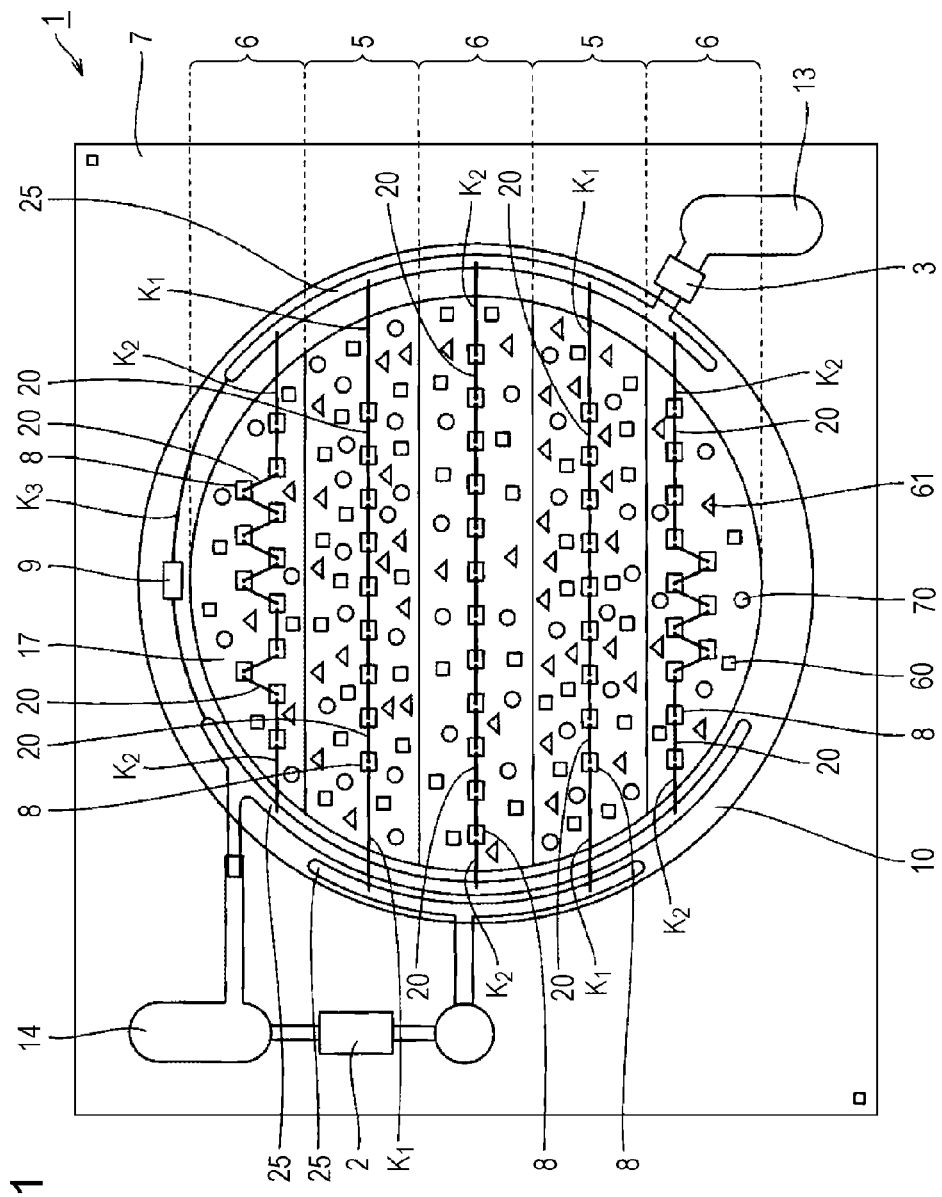
FIG. 1 is a perspective plan view schematically illustrating a light emitting device according to Embodiment 1 of the present invention.

Hereinafter, a light emitting device and a lighting device according to an embodiment of the present invention will be described with reference to the drawings. In the drawings, the same symbols or reference numerals represent the same parts or corresponding parts. In addition, a dimensional relationship, such as a length, a width, a thickness, and a depth is appropriately changed for the sake of clarification and simplification of the drawings, and actual dimensional relationship is not represented.

Embodiment 1

Figure 2:
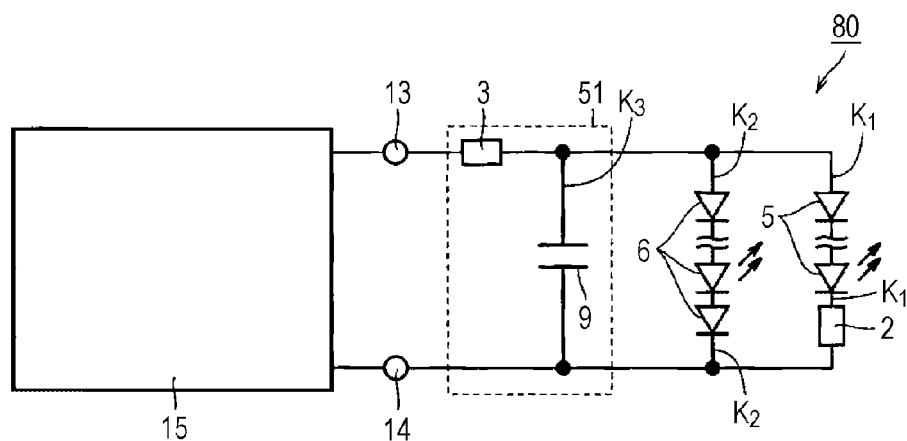
FIG. 2 is a schematic circuit diagram of a lighting device which uses the light emitting device of FIG. 1.
Figure 4:
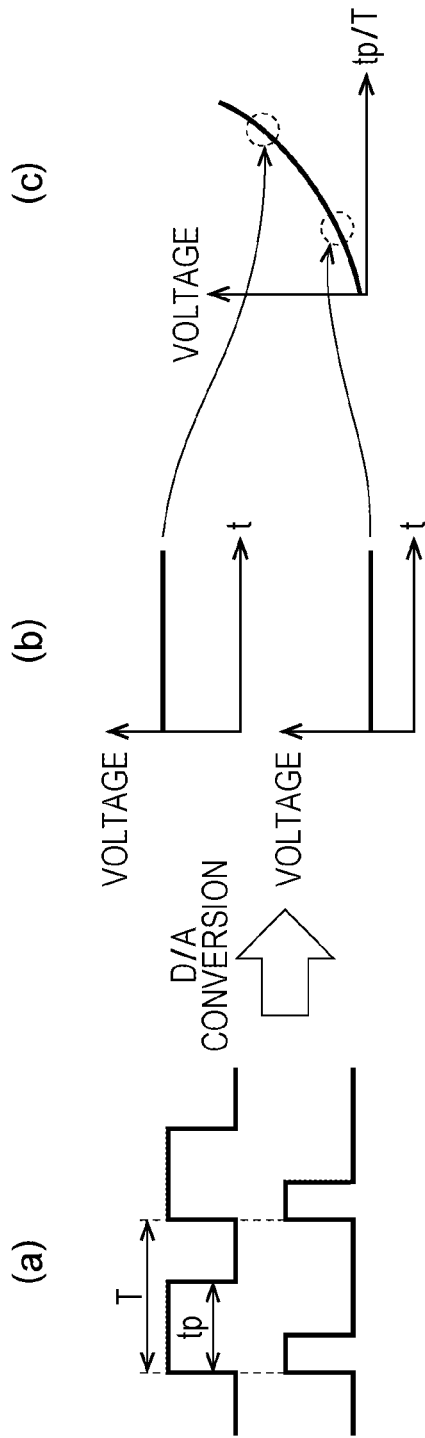
FIGS. 4(*a*) to 4(*c*) are diagrams illustrating D/A conversion of a pulse signal from a PWM signal type dimmer.

A light emitting device according to Embodiment 1 will be described with reference to FIG. 1, FIG. 2, and FIG. 4. FIG. 1 is a perspective plan view schematically illustrating a light emitting device according to Embodiment 1 of the present invention. FIG. 2 is a schematic circuit diagram of a lighting device 80 which uses the light emitting device of FIG. 1. FIGS. 4(a) to 4(c) are diagrams illustrating D/A conversion of a pulse signal from a PWM signal type dimmer.

As illustrated in FIG. 1 and FIG. 2, a light emitting device 1 includes an anode electrode land 13, a cathode electrode land 14, first light emitting units 5 and second light emitting units 6 which are electrically connected to the anode electrode land 13 and the cathode electrode land 14, are adjacently provided in parallel with each other, and a low pass filter 51 which includes a capacitance member 9 provided in parallel with the first light emitting units 5 and the second light emitting units 6 and includes a resistance member (a resistor 3 in FIG. 1) provided in series with the first light emitting units 5 and the second light emitting units 6. Electric resistance of the first light emitting unit 5 is larger than electric resistance of the second light emitting unit 6. The light emitting device 1 can adjust color temperature of light which is emitted from an entire emitting area including the first light emitting units 5 and the second light emitting units 6.

The first light emitting unit 5 includes first red phosphors 60, second red phosphors 61, green phosphors 70, LED elements 8, and light-transmitting resin 17. A resistor 2 is electrically connected in series between the first light emitting unit 5 and the cathode electrode land 14.

The second light emitting unit 6 includes the first red phosphors 60, the second red phosphors 61, the green phosphors 70, the LED elements 8, and the light-transmitting resin 17.

Conductive wires 25 respectively connected to the anode electrode land 13 and the cathode electrode land 14, a part of first wires $K_1$ and second wires $K_2$ which are connected to the conductive wires 25, and the capacitance member 9 are disposed under a resin dam 10.

The first light emitting units 5 and the second light emitting units 6 in the light emitting device 1 emit light as power is supplied from a single power supply. The lights which are emitted from the first light emitting units 5 and the light which is emitted from the second light emitting units 6 are combined together and the combined light is emitted outside as light which is emitted from the light emitting device 1.

If a ratio of currents flowing through the first light emitting units 5 and the second light emitting units 6 is changed, color temperatures of the first light emitting units 5 and the second light emitting units 6 do not change, but a ratio of luminous flux of each light emitting unit is changed. Hence, it is possible to change the color temperature of the light from the entire light emitting area which is combined light of the light emitted from the first light emitting unit 5 and the light emitted from the second light emitting unit 6.

The light emitting device 1 according to Embodiment 1 includes the low pass filter 51 including the capacitance member 9 provided in parallel with the first light emitting units 5 and the second light emitting units 6, and the resistor 3 provided in series with the first light emitting units 5 and the second light emitting units 6. Hence, if the light emitting device 1 of FIG. 1 is connected to a pulse width modulation (PWM) signal type dimmer 15 as illustrated in FIG. 2, a pulse signal from the PWM signal type dimmer 15 can be converted into a DC voltage. Thus, the light emitting device 1 can adjust color temperature of light which is emitted from the entire light emitting area including the first light emitting units 5 and the second light emitting units 6 by using the PWM signal type dimmer 15 which is a dimming circuit of LED elements in the related art.

(Low Pass Filter)

In the light emitting device 1, a circuit including the capacitance member 9 and the resistor 3 forms the low pass filter 51. Digital-analog conversion (hereinafter, referred to as D/A conversion) which is performed in a case where an electric signal of the PWM signal type dimmer passes through the low pass filter 51 will be described with reference to FIG. 4. Only capacitance components may be connected in parallel to the first light emitting units 5 and the second light emitting units 6, but it is preferable that a low pass filter is further used for reducing high frequency noise components.

A lighting device which uses LED elements normally performs dimming by using a PWM signal type dimmer. Specifically, the PWM signal type dimmer outputs a pulse wave illustrated in FIG. 4(a), changes lighting time by changing a duty ratio (tp/T) (tp indicates a width of a pulse, T indicates a cycle) of the pulse, thereby controlling the dimming of the lighting device. Hence, the PWM signal type dimmer cannot directly apply toning to a circuit configured only by the first light emitting units 5 and the second light emitting units 6, depending on a change of a current value.

In the present embodiment, D/A conversion of a pulse signal from the PWM signal type dimmer 15 into a DC voltage signal illustrated in FIG. 4(b) can be performed by the low pass filter including the capacitance member 9 and the resistor 3. Hence, as illustrated in FIG. 4(c), by changing the duty ratio (tp/T) of the pulse wave which is output from the PWM signal type dimmer 15, the DC voltage can be changed. Hence, in the present embodiment, it is possible to adjust color temperature of the light which is emitted from the entire light emitting area including the first light emitting units 5 and the second light emitting units 6 by using the PWM signal type dimmer 15.

A chip capacitor, an electrolytic capacitor, a film capacitor, or the like can be used as the capacitance member 9.

In Embodiment 1, a chip resistor or the resistor 3 configured by a printed resistor is used as the resistance member. An inductor can be used as the resistance member instead of the chip resistor or in addition to the chip resistor.

The capacitance member 9 and the resistor 3 may be formed under the resin dam or on an external side of the resin dam. By doing so, there is an effect that the light emitting device 1 can be minimized, it is possible to reduce that the light which is emitted from the LED elements 8 is absorbed by the capacitance member 9 and the resistor 3, or noise components are reduced.

(Anode Electrode Land, Cathode Electrode Land, Conductive Wire, Resin Dam)

The anode electrode land 13 and the cathode electrode land 14 are electrodes for external connection (for example, for power supply), and are formed of a material such as Ag—Pt. The anode electrode land 13 and the cathode electrode land 14 are provided to be exposed outside the resin dam 10. The anode electrode land 13 and the cathode electrode land 14 are electrically and respectively connected to the conductive wires 25, and the conductive wires 25 are electrically connected to light emitting elements through the first wire $K_1$ and the second wire $K_2$.

The conductive wires 25 are formed of Ag—Pt or the like, and are formed by a screen printing method or the like.

It is preferable that the resin dam 10 is a resin for blocking the first light emitting units 5 and the second light emitting units 6 which include the light-transmitting resin 17, and is configured with a colored material (may be a colored material with small absorption of white or milky white light, red light, yellow light, and green light). It is preferable that, if the resin dam 10 is formed to cover the conductive wires 25, absorption of light emitted from the LED element or light converted by a phosphor is reduced.

(First Light Emitting Unit, Second Light Emitting Unit)

The first light emitting unit 5 and the second light emitting unit 6 (hereinafter, referred to as "light emitting units" by combining both units) includes the LED elements 8, the light-transmitting resins 17, and the first red phosphors 60 uniformly dispersed in the light-transmitting resin, the second red phosphors 61 uniformly dispersed in the light-transmitting resin, and the green phosphors 70 uniformly dispersed in the light-transmitting resin.

In FIG. 1, the first light emitting units 5 and the second light emitting units 6 are arranged inside the same circle. The circle is divided into five sections by four parallel lines of line symmetry, the second light emitting units 6 are arranged in a central one section and two sections on both sides, and the first light emitting units 5 are arranged in the remaining two sections interposed between the sections where the second light emitting units 6 are arranged. In FIG. 1, since the first light emitting units 5 and the second light emitting units 6 are adjacent to each other on a boundary, lights which are emitted from each of the first light emitting units 5 and the second light emitting units 6 are easily combined together, and light with uniform color temperature can be emitted from the entire light emitting area. It is preferable that the first light emitting units 5 and the second light emitting units 6 are arranged to be adjacent to each other, but the first light emitting units 5 and the second light emitting units 6 may not necessarily be in contact with each other, as long as lights which are emitted from each of the first light emitting units 5 and the second light emitting units 6 are combined together. In this case, it is preferable that the first light emitting units 5 and the second light emitting units 6 are arranged in a close distance such that lights which are emitted from each light emitting unit are sufficiently combined together.

An entire shape of the light emitting units including the first light emitting units 5 and the second light emitting units 6 is not limited to the circular shape illustrated in FIG. 1, as long as the lights which are emitted from each of the first light emitting units 5 and the second light emitting units 6 can be combined together. For example, the entire shape of the light emitting units can be formed by an arbitrary shape, such as a substantially rectangular shape, a substantially elliptical shape, or a polygonal shape. Shapes of each of the first light emitting units 5 and the second light emitting units 6 which are arranged in the inside of the entire light emitting area are not limited in particular. For example, it is preferable that shapes are provided in which surface areas of each of the first light emitting units 5 and the second light emitting units 6 are the same as each other. Such shapes can be obtained by disposing, for example, the first light emitting units 5 in a first section and the second light emitting units 6 in a second section, while the first section and the second section are obtained by equally dividing the entire light emitting area by using a line passing through the center thereof.

In addition, if color temperature of the lights which are emitted from each of the first light emitting units 5 and the second light emitting units 6 are adjustable, the surface areas of each of the first light emitting units 5 and the second light emitting units 6 may be the same as each other. For example, the first light emitting unit can be formed in a circular shape, and the second light emitting unit may be disposed in a donut shape to surround an outer circumference of the first light emitting unit. By doing so, the lights which are emitted from each of the first light emitting units and the second light emitting units 6 can be easily combined, and the entire light emitting area can emit light with uniform color temperature.

In the light emitting unit, a part of primary light (for example, blue light) emitted from the LED elements 8 is converted into green light and red light by a green phosphor and a red phosphor. Thus, in the light emitting device according to the present embodiment emits light which is obtained by combining the primary light, the green light, and the red light, and preferably emits white light. A combination ratio of the green phosphor and the red phosphor is not limited in particular, but it is preferable that the combination ratio is set to obtain a desired characteristics.

By changing the amount of currents flowing through each of the first light emitting units 5 and the second light emitting units 6, luminous flux of the light which is emitted from the first light emitting units 5 and luminous flux of the light which is emitted from the second light emitting units 6 are adjustable.

In a case where a current flowing through the light emitting units is set as a rated current value, it is preferable that the color temperature (hereinafter, also referred to as Tcmax) of the light which is obtained by combining the light emitted from the first light emitting units 5 and the light emitted from the second light emitting units 6 and is emitted from the entire light emitting device is 2700 K to 6500 K.

If the amount of currents is less than the rated current value, the luminous flux of the light emitted from the first light emitting units 5 and the light emitted from the second light emitting units 6 is reduced, the luminous flux of the light emitted from the entire light emitting device (light emitting units) is reduced, and color temperature is decreased. In a case where the current flowing through the light emitting unit is set as the rated current value, the luminous flux of the light emitted from the entire light emitting device is set to 100%, when the luminous flux of the light emitted from the entire light emitting device is adjusted to 20% by reducing the amount of currents, it is preferable that the color temperature of the light emitted from the entire light emitting device is decreased more than Tcmax by 300 K or more, from the viewpoint of obtaining a wide range of color temperature.

(Resistor)

The resistor 2 is connected to the first light emitting units 5. By changing a magnitude of resistance of the resistor 2, the amount of currents flowing through the first light emitting units 5 and the second light emitting units 6 can be adjusted. The luminous flux of the light which is emitted from the LED elements 8 connected to the first light emitting units 5 or the second light emitting units 6 is also changed, and the luminous flux of the light which is emitted from the first light emitting units 5 and the second light emitting units 6 is also changed, depending on a change of the amount of currents flowing through the first light emitting units 5 and the second light emitting units 6. If the luminous flux of the light which is emitted from the light emitting units is changed, the color temperature of the light is also changed, and thus, it is possible to adjust the color temperature of the light which is emitted from the entire light emitting device by changing the amount of currents.

The resistor 2 can be formed by using a chip resistor or a printed resistor.

In Embodiment 1, the resistor is connected only to the first light emitting units 5, but the resistor may also be connected to the second light emitting units 6. In this case, resistors which are connected to each light emitting unit are selected such that a resistance value of the first light emitting unit is larger than a resistance value of the second light emitting unit.

(LED Element)

It is preferable that the LED element 8 is an LED element which emits light including light with blue components whose peak light emission wavelength exists in a blue region (region where a wavelength is longer than or equal to 430 nm and shorter than or equal to 480 nm). In a case where an LED element whose peak light emission wavelength is shorter than 430 nm is used, a contribution ratio of the blue components to the light which is emitted from the light emitting device is decreased, thereby, causing deterioration of color rendering properties, and thus, practicality of the light emitting device may be reduced. In a case where an LED element whose peak light emission wavelength exceeds 480 nm is used, the practicality of the light emitting device is reduced. Particularly, since quantum efficiency of an InGaN-based LED element is reduced, the practicality of the light emitting device is significantly reduced.

It is preferable that the LED element 8 is the InGaN-based LED element. As an example of the LED element 8, an LED element whose peak light emission wavelength is approximately 450 nm can be provided. Here, the "InGaN-based LED element" means an LED element whose light emitting layer is an InGaN layer.

The LED element 8 has a structure in which light is emitted from an upper surface thereof. In addition, the LED element 8 has element chip pad for connecting adjacent LED elements through a wire 20 included in the first wire $K_1$ or the second wire $K_2$, and for connecting the LED elements 8 to the conductive wire 25 through the first wire $K_1$ or the second wire $K_2$, on a surfer thereof.

(Light-Transmitting Resin)

The light-transmitting resin 17 included in the light emitting unit is not limited, as long the resin has light transmittance, and it is preferable that the resin is, for example, epoxy resin, silicone resin, urea resin, or the like.

(Red Phosphor)

The first red phosphor 60 and the second red phosphor 61 (hereinafter, referred to as a "red phosphor by including both phosphors) are excited by primary light emitted from the LED elements 8, and emit light with the peak light emission wavelength to a red region. The red phosphor does not emit light in a wavelength range longer than or equal to 700 nm and does not absorb light in a wavelength range longer than or equal to 550 nm and shorter than or equal to 600 nm, at a temperature higher than or equal to 300 K. That "the red phosphor does not emit light in a wavelength range longer than or equal to 700 nm" means that light emission intensity of the red phosphor in the wavelength range longer than or equal to 700 nm is smaller than or equal to $\frac{1}{100}$ times the light emission intensity of the red phosphor in the peak light emission wavelength, at a temperature higher than or equal to 300 K. That "the red phosphor does not absorb light in a wavelength range longer than or equal to 550 nm and shorter than or equal to 600 nm means that an integrated value of excitation spectrum in which the red phosphor is in the wavelength range longer than or equal to 550 nm and shorter than or equal to 600 nm is smaller than or equal to $\frac{1}{100}$ times the integrated value of excitation spectrum in which the red phosphor is in the wavelength range longer than or equal to 430 nm and shorter than or equal to 480 nm. A measurement wavelength of the excitation spectrum is referred to as a peak wavelength of the red phosphor. The "red region" indicates a region where a wavelength is longer than or equal to 580 and shorter than 700 nm, in the present specification.

Emission of light of the red phosphor can be hardly confirmed in a long wavelength region longer than or equal to 700 nm. Human visual sensitivity is relatively small in the long wavelength region longer than or equal to 700 nm. Accordingly, in a case where the light emitting device is used for, for example, light or the like, it is very advantageous to use the red phosphor.

In addition, since the red phosphor does not absorb light in a wavelength range longer than or equal to 550 nm and shorter than or equal to 600 nm, secondary light from the green phosphor is hard to be absorbed. Thus, it is possible to prevent two-step light emission in which the red phosphor absorbs the secondary light from the green phosphor and emits light from occurring. Hence, high light emission efficiency is maintained.

The red phosphor is not limited in particular as long as the red phosphor is used for a wavelength converting unit of the light emitting device, but, for example, (Sr,Ca)AlSiN$_3$:Eu-based phosphor, CaAlSiN$_3$:Eu-based phosphor, or the like can be used.

(Green Phosphor)

The green phosphor 70 is excited by the primary light emitted from 08 is excited by the primary light emitted from the LED element 8, and emits light with peak light emission wavelength in the green region. The green phosphor is not limited in particular as long as the green phosphor is used for the wavelength converting unit of the light emitting device, but a phosphor or the like which is represented by, for example, general formula (1): $(M1)_{3-x}Ce_x(M2)_5O_{12}$ (in the formula, (M1) represents at least one of Y, Lu, Gd, and La, (M2) represents at least one of Al and Ga, and x indicating a composition ratio (concentration) of Ce satisfies 0.005≤x≤0.20) can be used. The "green region" means a region where a wavelength is longer than or equal to 500 nm and shorter than or equal to 580 nm.

It is preferable that a half width of fluorescence spectrum of the green phosphor is wide in a case where the green phosphor of one type is used (for example, in a case of general lighting or the like), and, for example, it is preferable that the half width is longer than or equal to 95 nm. A phosphor which uses Ce as an activator, for example, $Lu_{3-x}Ce_xAl_5O_{12}$-based green phosphor which is represented by the general formula (1) has a Garnet crystal structure. Since the phosphor uses Ce as an activator, fluorescence spectrum with a wide half width (half width greater than or equal to 95 nm) is obtained. Thus, a phosphor which uses Ce as an activator is a green phosphor suitable for obtaining high color rendering properties.

(Additive)

The light emitting unit may contain additive, such as $SiO_2$, $TiO_2$, $ZrO_2$, $Al_2O_3$, or $Y_2O_3$, in addition to the light-transmitting resin, the green phosphor and the red phosphor. If the light emitting unit contains such additive, it is possible to obtain effects that phosphor such as green phosphor and red phosphor is prevented from precipitating, or light from the LED element, the green phosphor, and the red phosphor is efficiently diffused.

Embodiment 2

Figure 5:
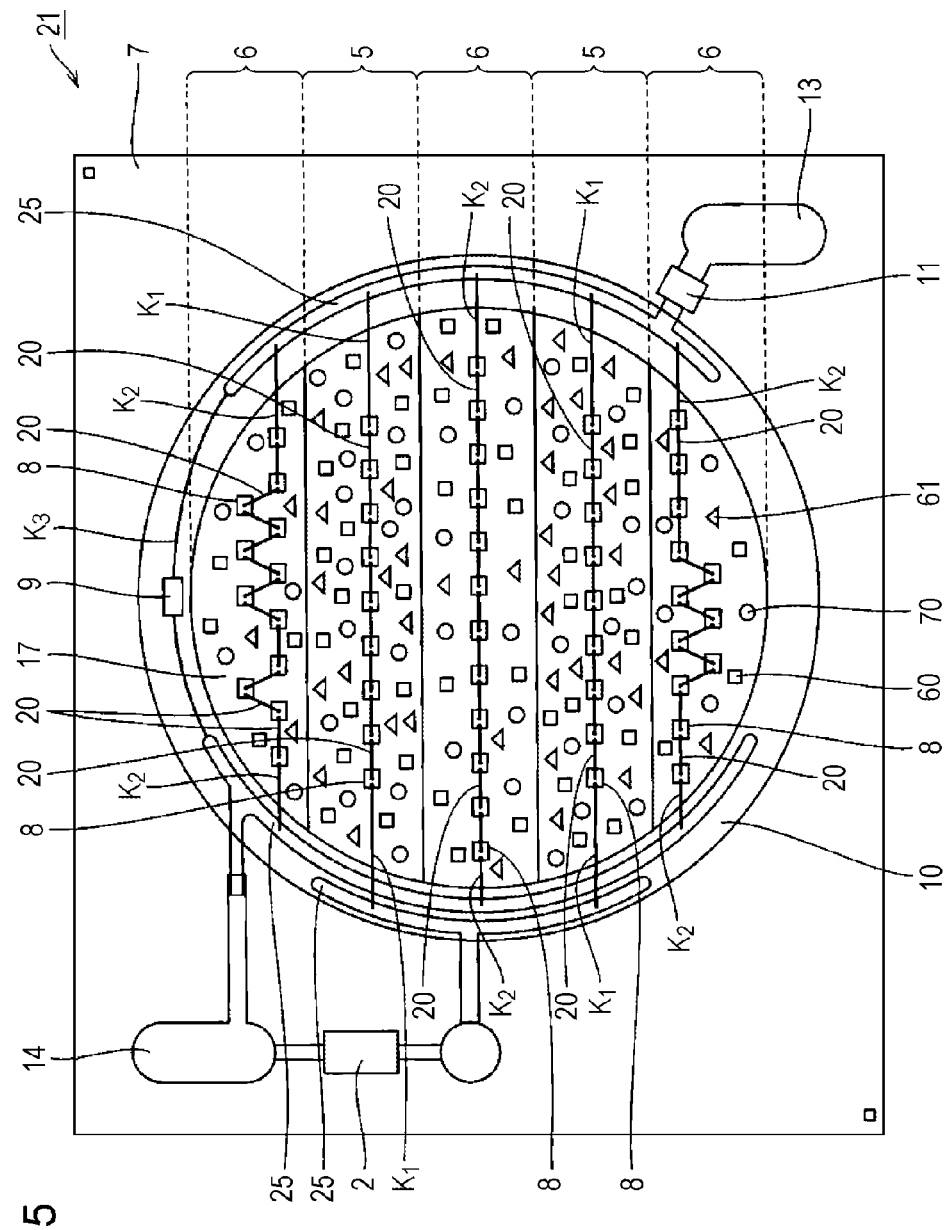
FIG. 5 is a perspective plan view schematically illustrating a light emitting device according to Embodiment 2 of the present invention.
Figure 6:
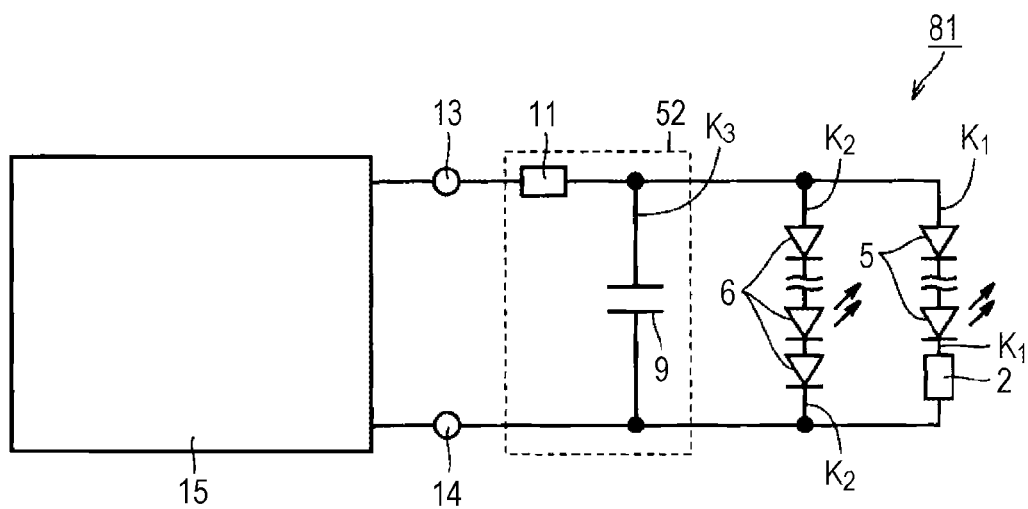
FIG. 6 is a schematic circuit diagram of a lighting device which uses the light emitting device of FIG. 5.

A light emitting device according to Embodiment 2 of the present invention will be described with reference to FIG. 5 and FIG. 6. FIG. 5 is a perspective plan view schematically illustrating a light emitting device 21 according to Embodiment 2. FIG. 6 is a schematic circuit diagram of a lighting device 81 which is manufactured by connecting the light emitting device 21 of FIG. 5 to the PWM signal type dimmer 15.

The light emitting device 21 according to Embodiment 2 has the same configuration as the light emitting device 1 according to Embodiment 1 as a basic configuration. A point different from Embodiment 1 is a point that an inductor 11 is used as a resistance member. By using an inductor as a resistance member, power loss of the resistance member can be reduced, compared with a case where a resistor is used as the resistance member. In Embodiment 2, by using the capacitor 9 and the inductor 11, a second low pass filter 52 is formed, and thus, it is possible to reduce ripple components of an output signal.

A coil can be used as the inductor 11. Any of a coil having a winding structure, a coil having a lamination structure, and a coil having a film structure can be used as the coil.

The coil having a winding structure has a structure in which a copper wire is spirally wound on an alumina core. The coil having a winding structure can have low DC resistance, a high Q value which is a parameter indicating quality of the inductor, small loss, and excellent characteristics, and can correspond to a large current.

The coil having a lamination structure is a monolithic type in which a ceramic material and a coil conductor are laminated and integrated. The coil having a lamination structure can be minimized and can be manufactured with a low cost, compared with the winding structure.

The coil having a film structure is a chip inductor in which a shape of the coil is realized on a ceramic material with high precision in the coil having the lamination structure. The coil having the film structure can be formed as a very high precision coil.

Embodiment 3

Figure 7:
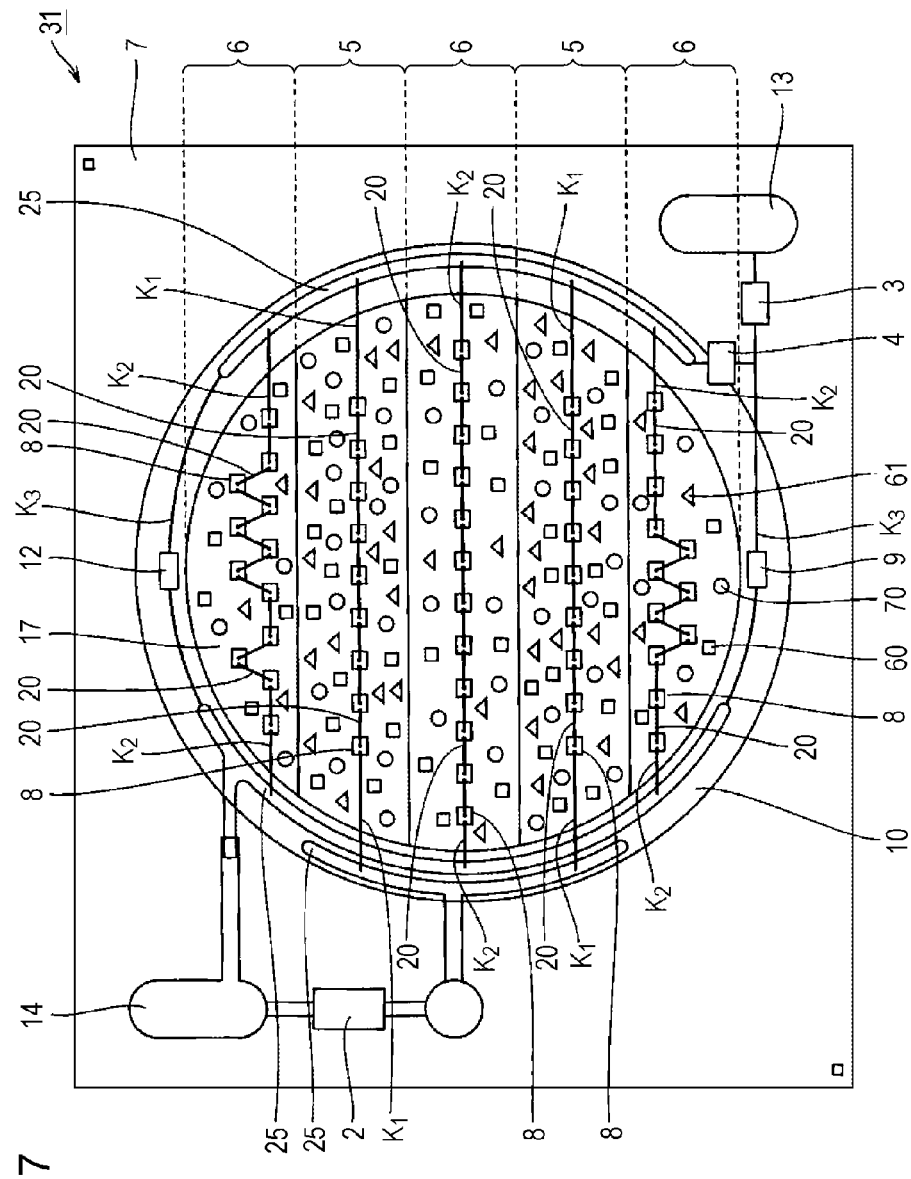
FIG. 7 is a perspective plan view schematically illustrating a light emitting device according to Embodiment 3 of the present invention.
Figure 8:
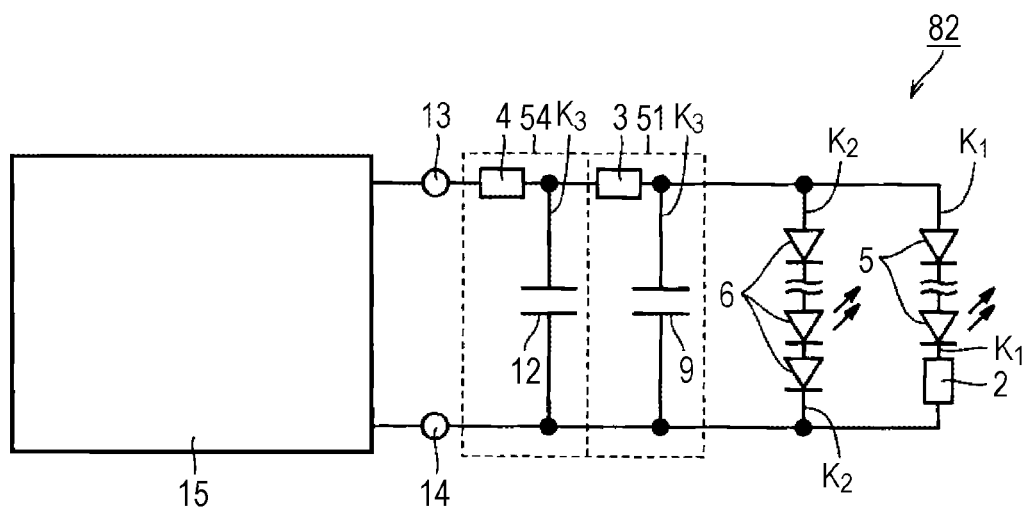
FIG. 8 is a schematic circuit diagram of a lighting device which uses the light emitting device of FIG. 7.

A light emitting device according to Embodiment 3 of the present invention will be described with reference to FIG. 7 and FIG. 8. FIG. 7 is a perspective plan view schematically illustrating a light emitting device 31 according to Embodiment 3. FIG. 8 is a schematic circuit diagram of a lighting device 82 which is manufactured by connecting the light emitting device 31 of FIG. 7 to the PWM signal type dimmer 15.

The light emitting device 31 according to Embodiment 2 has the same configuration as the light emitting device 1 according to Embodiment 1 as a basic configuration. A point different from Embodiment 1 is that a low pass filter 54 including a capacitance member 12 connected in parallel to the first light emitting units 5 and the second light emitting units 6, and a resistor 4 provided in series to the first light emitting units 5 and the second light emitting units 6 is included in addition to the low pass filter 51 including the resistor 3 and the capacitance member 9. That is, the light emitting device 31 according to Embodiment 3 includes the low pass filters with multiple stages. Thereby, the light emitting device 31 can reduce noise and ripple components of an output signal.

In FIG. 7 and FIG. 8, the low pass filters are formed in two stages, but the number of the low pass filters is not limited in particular, and the low pass filters may be formed in three stages or more. In addition, in Embodiment 3, a resistor is used as a resistance member, but an inductor can be used instead of the resistor or in addition to the resistor.

Embodiment 4

Figure 9:
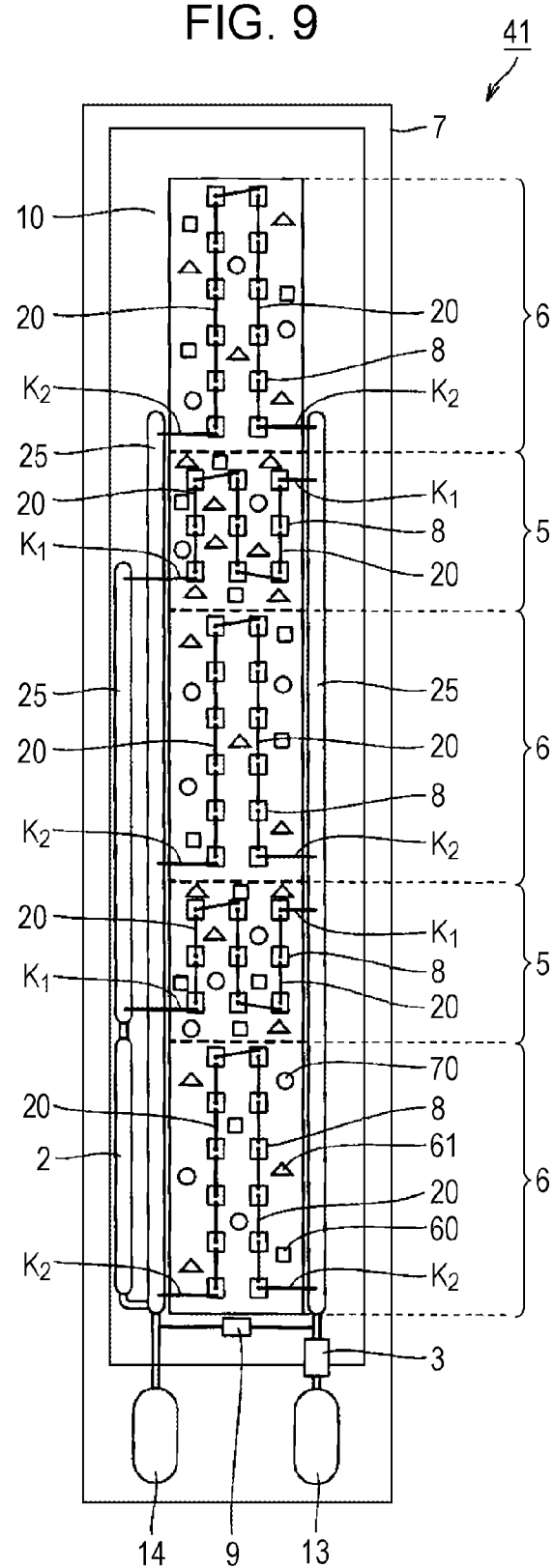
FIG. 9 is a perspective plan view schematically illustrating a light emitting device according to Embodiment 4 of the present invention.
Figure 10:
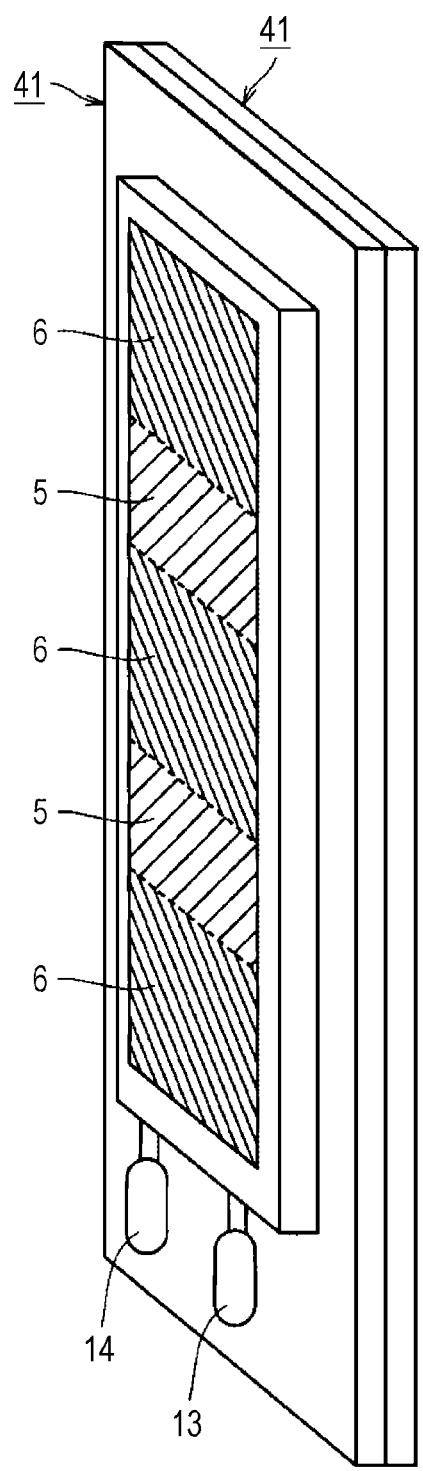
FIG. 10 is a perspective view of a modification example of the light emitting device of FIG. 9.
Figure 11:
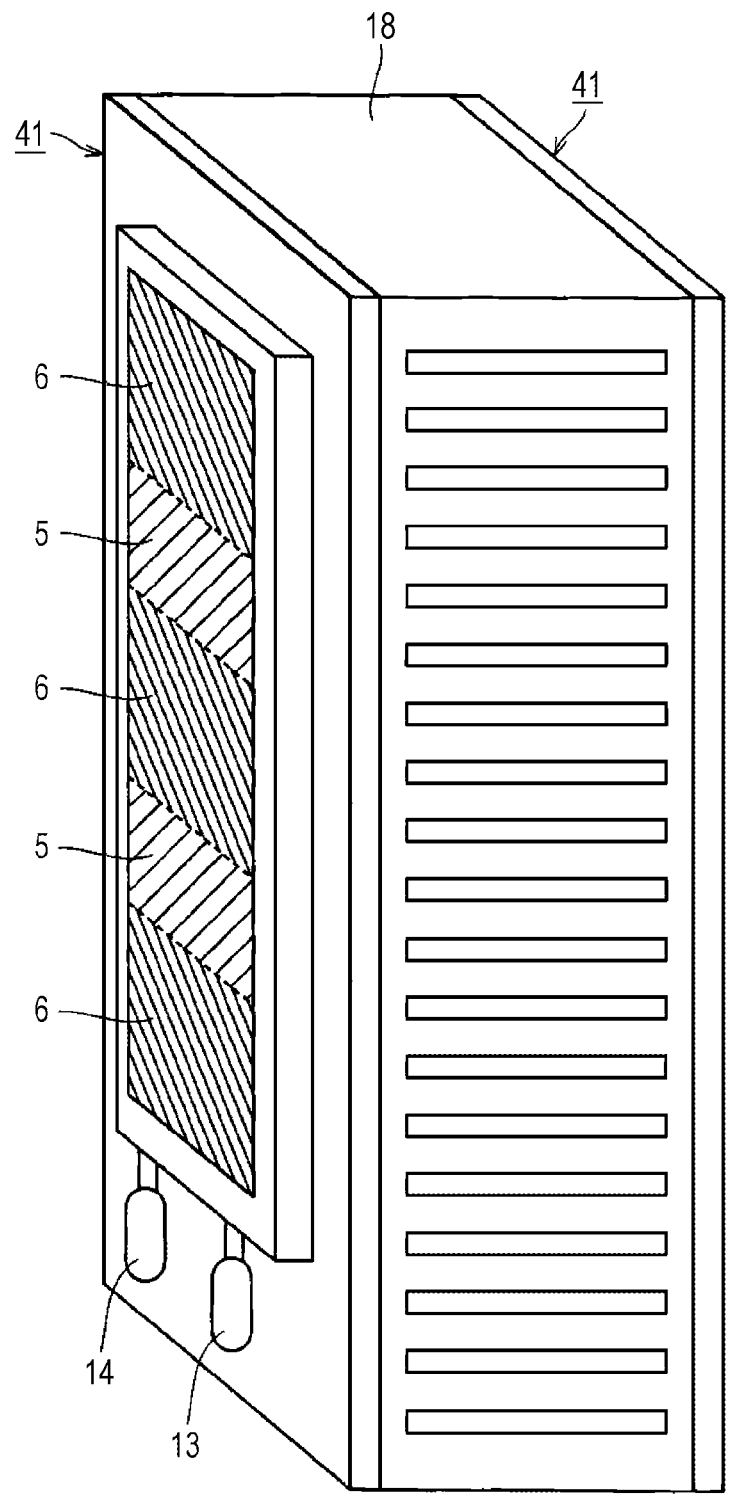
FIG. 11 is a perspective view of a modification example of the light emitting device of FIG. 9.
Figure 12:
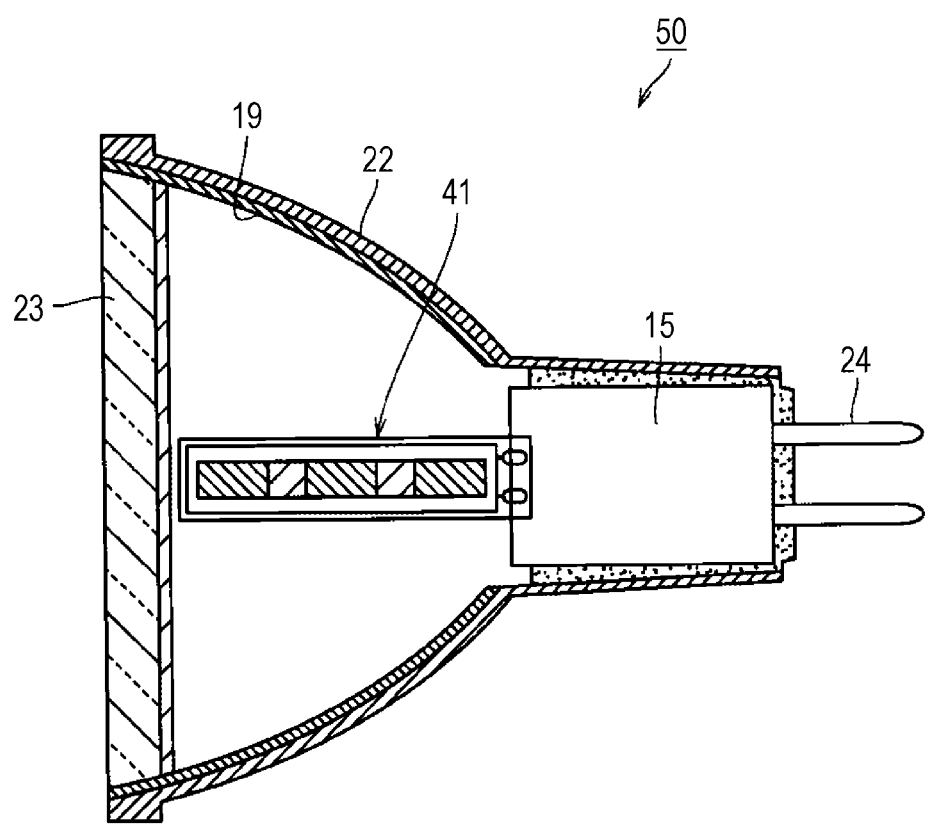
FIG. 12 is a schematic sectional view of a lighting device which uses the light emitting device of FIG. 9.
Figure 13:
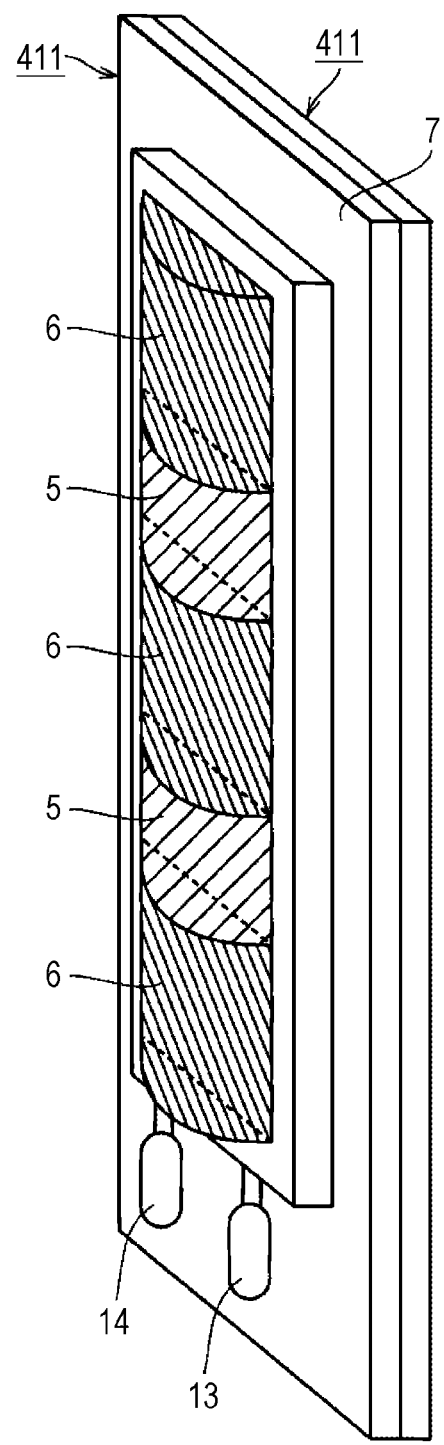
FIG. 13 is a perspective view of a modification example of the light emitting device of FIG. 9.
Figure 14:
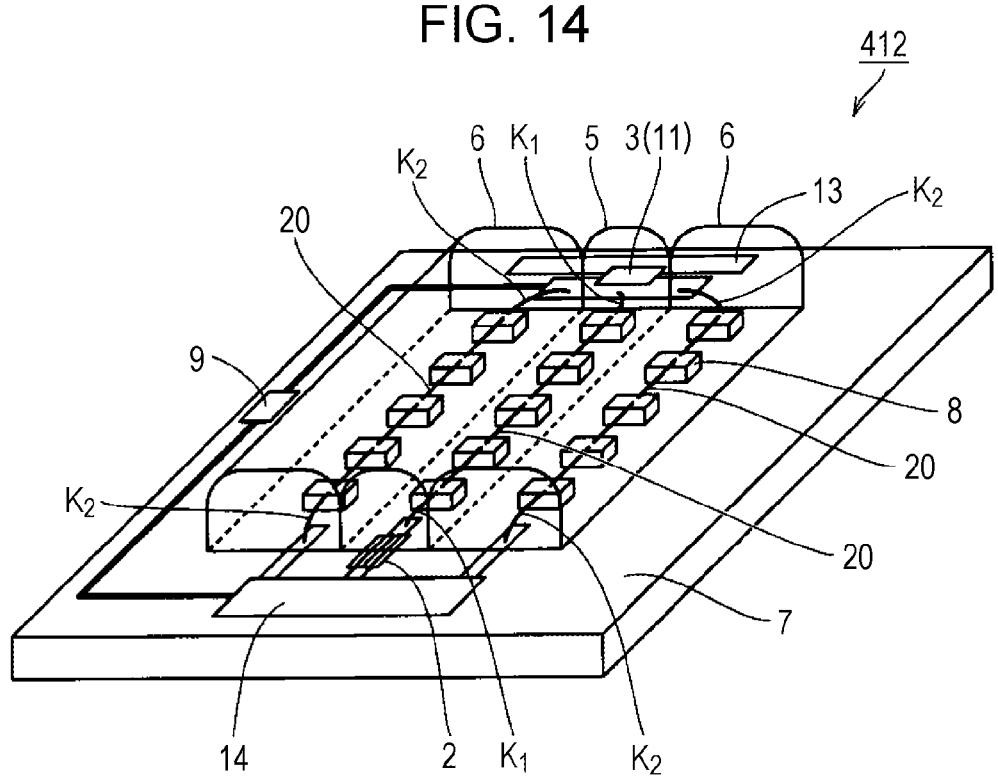
FIG. 14 is a perspective view of a modification example of the light emitting device of FIG. 9.
Figure 15:
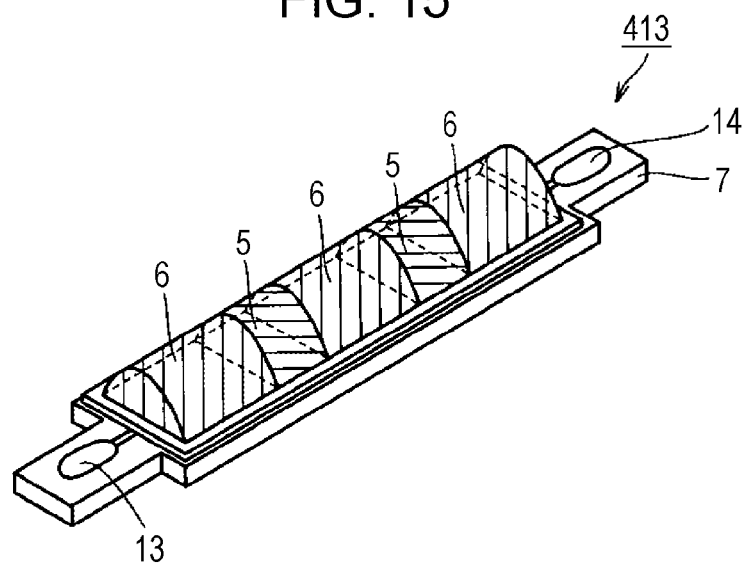
FIG. 15 is a perspective view of a modification example of the light emitting device of FIG. 13.

A light emitting device according to Embodiment 4 will be described with reference to FIG. 9 to FIG. 15. FIG. 9 is a perspective plan view schematically illustrating the light emitting device according to Embodiment 4. FIG. 10 is a perspective view of a modification example of the light emitting device of FIG. 9. FIG. 11 is a perspective view of a modification example of the light emitting device of FIG. 9. FIG. 12 is a schematic sectional view of a lighting device which uses the light emitting device of FIG. 9. FIG. 13 is a perspective view of a modification example of the light emitting device of FIG. 9. FIG. 14 is a transparent perspective view of a modification example of the light emitting device of FIG. 9. FIG. 15 is a perspective view of a modification example of the light emitting device of FIG. 13.

As illustrated in FIG. 9, a light emitting device 41 according to Embodiment 4 has the same configuration as the light emitting device according to Embodiment 1 as a basic configuration. A point different from Embodiment 1 is a point that the entire light emitting area which is formed by the first light emitting units 5 and the second light emitting units 6 has a rectangular shape in a planar view of the light emitting device viewed from an upper side thereof. By forming the shape of the light emitting unit as a rectangle, the light emitting device is suitable for being used for lighting of a straight tube type or the lighting device having a structure illustrated in FIG. 12. In FIG. 9, each of the first light emitting units 5 and the second light emitting units 6 has a rectangular shape, the respective short sides are in contact with each other, but long sides thereof may be in contact with each other.

As illustrated in FIG. 10, the light emitting device 41 of FIG. 9 may be used by laminating two layers. Thereby, it is possible to obtain light in which lights widely distributed in almost all circumferential directions are combined together and colors thereof are combined together.

As illustrated in FIG. 11, the light emitting devices 41 of FIG. 9 may interpose a heat sink 18 of a rectangular shape therebetween and may be fixed on both sides of main surfaces facing the heat sink. Thereby, heat dissipation can be ensured. The number of the light emitting devices 41 which are fixed to the heat sink 18 is not limited to two pieces, and may be three pieces or more.

As illustrated in FIG. 12, the light emitting device 41 of FIG. 9 can be used as a light emitting unit of a lighting device 50. The lighting device 50 includes a housing 22 which includes a protruded portion formed in a region including an approximately hemispherical shape and the vertex of the hemisphere, a reflector 19 which covers the inside of the housing 22, a front surface cover 23 disposed in an opening of the housing 22, a PWM signal type dimming circuit 15 disposed in the inside of the protruded portion of the housing 22, and a G base 24 connect to the PWM signal type dimming circuit 15. The lighting device 50 can adjust color temperature of the light which is emitted from an entire light emitting area including the first light emitting units 5 and the second light emitting units 6 by using the PWM signal type dimmer 15 which is a dimming circuit of LED elements of the related art. In FIG. 12, the light emitting device 41 of FIG. 9 is used as the light emitting unit, but the light emitting devices illustrated in FIG. 10 and FIG. 11 can also be used.

As long as lights which are emitted from each of the first light emitting units 5 and the second light emitting units 6 can be combined together, arrangement of the first light emitting units and the second light emitting units is not limited in particular. For example, as illustrated in FIG. 14, the light emitting unit can be divided into three sections, the first light emitting units 5 can be arranged in one section of the center, and the second light emitting units 6 can be arranged in two sections on both sides.

As illustrated in FIG. 13, the first light emitting units 5 and the second light emitting units 6 can be stereoscopically formed on a substrate 7 at a height exceeding the resin dam. By doing so, light which is emitted from the LED element, the red phosphor, and the green phosphor to a side of the light emitting device is diffusely reflected from a surface of the light emitting unit to be distributed in all directions of the light emitting device, and a light emitting device 411 with excellent light distribution property can be obtained.

In addition, as illustrated in FIG. 14, the first light emitting unit 5 and the second light emitting units 6 can be stereoscopically formed on the substrate 7. By doing so, although a resin dam or a reflector is not disposed, light which is emitted from the LED element, the red phosphor, and the green phosphor to a side of the light emitting device is diffusely reflected from a surface of the light emitting unit to be distributed in all directions of the light emitting device, and a light emitting device 412 with excellent light distribution property can be obtained.

A modification example of the light emitting device of FIG. 13 is illustrated in FIG. 15. In a light emitting device 413, the first light emitting units 5 and the second light emitting units 6 are stereoscopically formed on the substrate 7. The cathode electrode land 14 and the anode electrode land 13 face each other and the light emitting units are interposed therebetween. Thereby, it is possible to obtain the light emitting device which has an elongated light emitting unit (for example, a width of 2 mm, a length of 40 mm) and can adjust color from a low color temperature to a high color temperature.

Particularly, the light emitting device 413 of FIG. 15 can be realized by an optimal structure as a light source of an LED type light bulb. It is preferable that one or a plurality of light emitting devices 413 are used, and particularly, it is preferable that a plurality of light emitting devices are used. In addition, a plurality of light emitting devices 413 can be bonded together to use.

Embodiment 5

Figure 16:
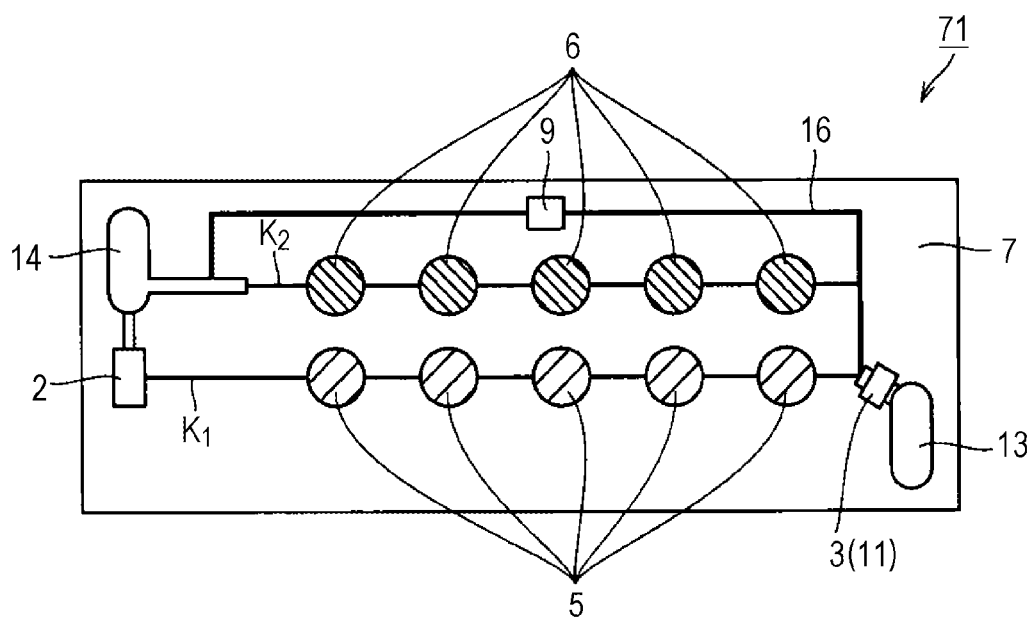
FIG. 16 is a plan view schematically illustrating a light emitting device according to Embodiment 5 of the present invention.

A light emitting device according to Embodiment 5 of the present invention will be described with reference to FIG. 16. FIG. 16 is a plan view schematically illustrating the light emitting device according to Embodiment 5.

A light emitting device 71 according to Embodiment 5 has the same configuration as the light emitting device according to Embodiment 1 as a basic configuration. A point different from Embodiment 1 is that the first light emitting units 5 in five locations are connected in series to each other on the first wire $K_1$, the second light emitting units 6 in five locations are connected in series to each other on the second wire $K_2$, and the first light emitting units 5 and the second light emitting units 6 are arranged at a distance close enough to allow the lights which are emitted from those to be sufficiently combined, without being adjacent to each other.

Specifically, the light emitting device 71 includes the anode electrode land 13, the cathode electrode land 14, and the first wire $K_1$ and the second wire $K_2$ and a wiring pattern 16 which connect the anode electrode land 13 to the cathode electrode land 14, each being arranged on the substrate 7.

The resistor 2 is connected in series to the first wire $K_1$, and electric resistance of the first wire $K_1$ is larger than electric resistance of the second wire $K_2$. The resistor 2 is a member for adjusting current flowing through the first light emitting units 5 and the second light emitting units 6. Adjustment of the currents can be performed by adjusting the number of light emitting units or can also be performed by mounting LED elements with different voltage values for emitting light.

The resistor 3 is connected in series to the first light emitting units 5 and the second light emitting units 6. The resistor 3 can be replaced with the inductor 11. The capacitance member 9 is connected in parallel to the first light emitting units 5 and the second light emitting units 6 by the wiring pattern 16.

Since the first light emitting units 5 and the second light emitting units 6 are arranged at a distance close enough to allow the lights which are emitted from those to be sufficiently combined together, lights which are emitted from the entire light emitting device become light with uniform color temperature. It is preferable that the shortest distance between outer edges of each light emitting unit is shorter than or equal to 28 mm, and it is more preferable that the shortest distance is shorter than or equal to 22 mm, in a distance between the first light emitting unit 5 and the second light emitting unit 6. If the distance between the first light emitting unit 5 and the second light emitting unit 6 is shorter than or equal to 28 mm, the lights which are emitted from each of the first light emitting units 5 and the second light emitting units 6 can be sufficiently combined.

Embodiment 6

A lighting device 80 according to Embodiment 6 will be described with reference to FIG. 1 and FIG. 2. FIG. 1 is a perspective plan view schematically illustrating the light emitting device according to Embodiment 1 of the present invention. FIG. 2 is a schematic circuit diagram of the lighting device 80 which uses the light emitting device of FIG. 1.

As illustrated in FIG. 2, the light emitting device 1 according to Embodiment 1 is connected to the PWM signal type dimming circuit. The light emitting device 1 according to Embodiment 1 includes the low pass filter 51 including the capacitance member 9 provided in parallel to the first light emitting units 5 and the second light emitting units 6, and the resistor 3 provided in series to the first light emitting units 5 and the second light emitting units 6. Hence, if the light emitting device 1 is connected to the pulse width modulation (PWM) signal type dimmer 15, a pulse signal from the PWM signal type dimmer 15 can be converted into a DC voltage. Thus, the lighting device 80 can adjust color temperature of light which is emitted from an entire light emitting area including the first light emitting units 5 and the second light emitting units 6, by using the PWM signal type dimmer 15 which is a dimming circuit of LED elements in the related art.

EXAMPLE

The present invention will be further specifically described by using examples.

Example 1

In Example 1, a test was performed by using a light emitting device having the same configuration as in FIG. 1 and FIG. 2 of Embodiment 1.

A ceramic substrate was used for the substrate 7. The resistor 2 is a chip resistor with a resistance value of 60Ω. The resistor 3 is a chip resistor with a resistance value of 10Ω. In a case where a PWM frequency is 10 kHz, the capacitance member 9 is a chip capacitor with capacitance of approximately 100 μF.

The resistor 3 and the capacitance member 9 are electrically connected to each other through a conductive wire $K_3$, and form the low pass filter 51. In a case where capacitance of the capacitance member 9 is referred to as C and resistance of the resistor 3 is referred to as R, a cutoff frequency fc is represented by $1/2\pi CR$. If the cutoff frequency fc increases with respect to a PWM signal frequency F, ripple components due to high frequency components are not removed and voltage variation increases, and thereby, frequencies are set such that the PWM signal frequency F>>the cutoff frequency fc. In Example 1, as a PWM signal passes through the low pass filter 51, D/A conversion of the PWM signal is performed, and a value of a DC current flowing through the first wire $K_1$ and the second wire $K_2$ can be controlled.

In the first light emitting units 5 and the second light emitting units 6, the first red phosphors 60 ($CaAlSiN_3$:Eu), the second red phosphors 61 ((Sr,Ca)$AlSiN_3$:Eu), the green phosphors 70 ($Lu_3Al_5O_{12}$:Ce), and the LED elements 8 (light emission wavelength 450 nm) are sealed with silicone resin. The LED elements 8 and the conductive wires 25 are electrically connected to the first wires $K_1$ or the second wires $K_2$, and the conductive wires 25 are electrically connected to the anode electrode land 13 or the cathode electrode land 14.

Color temperature of light which is emitted from the first light emitting units 5 of the light emitting device of Example 1 is set to 2000 K, and color temperature of light which is emitted from the second light emitting units 6 is set to 3000 K. Next, a relationship between a total (hereinafter, also referred to as a total forward current) size of a forward current flowing through the first wires $K_1$ and the second wires $K_2$ and color temperature of light which is emitted from the light emitting device was examined.

When the total forward current of 350 mA flowed, the color temperature of the light which was emitted from the entire light emitting device was 2900 K, and when the total forward current of 50 mA flowed, the color temperature of the light which was emitted from the entire light emitting device was 2000 K.

Figure 3:
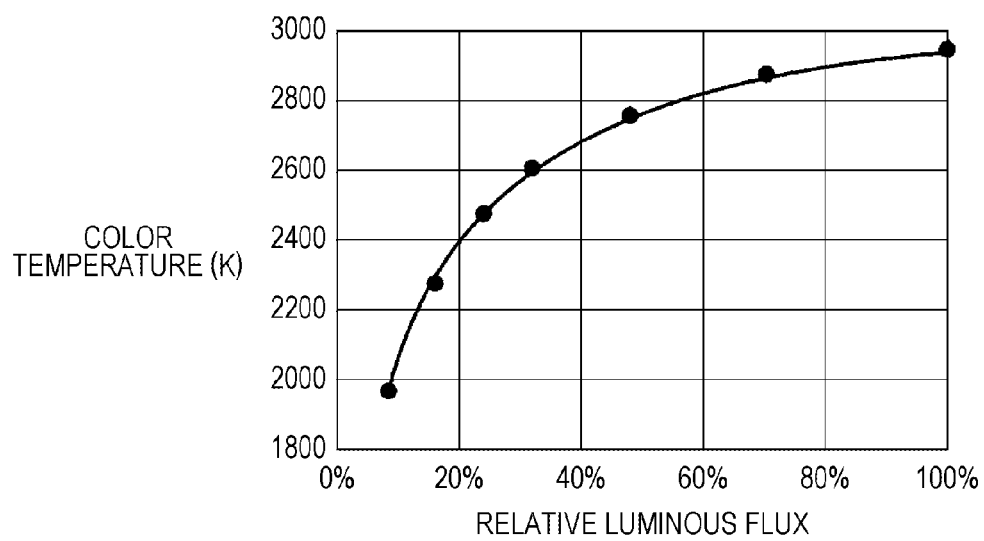
FIG. 3 is a graph illustrating a relationship between relative luminous flux of light which is emitted from the light emitting device and color temperature.

FIG. 3 is a graph illustrating a relationship between relative luminous flux (%) and color temperature of the light when the total forward current is changed, in a state where luminous flux of the light which is emitted from the entire light emitting device is set to 100% when the total forward current of 350 mA flows. It can be seen from FIG. 3, that, if the relative luminous flux decreases, the color temperature decreases.

Example 2

In Example 2, a test was performed by using a light emitting device according to Example 2 having the same configuration as in FIG. 5 and FIG. 6. The configuration of the light emitting device according to Embodiment 2 is basically the same as the configuration of the light emitting device according to Example 1. The light emitting device according to Example 2 is different from the configuration of Example 1 in that the inductor 11 is used instead of the resistor 3. The inductor 11 is a coil with inductance of 10 mH. In a case where a PWM frequency is set to 10 kHz, the capacitance member 9 is a chip capacitor with capacitance of approximately 100 μF.

The inductor 11 and the capacitor 9 are electrically connected to each other through the conductive wire $K_3$, and form the second low pass filter 52. In a case where capacitance of the capacitance member 9 is referred to as C and inductance of the inductor 11 is referred to as L, the cutoff frequency fc is represented by $1/2\pi\sqrt{(CL)}$. If the cutoff frequency fc increases with respect to a PWM signal frequency F, ripple components due to high frequency components are not removed and voltage variation increases, and thereby, frequencies are set such that the PWM signal frequency F>>the cutoff frequency fc. In Example 2, as a PWM signal passes through the low pass filter 52, D/A conversion of the PWM signal is performed, and a value of a DC current flowing through the first wire $K_1$ and the second wire $K_2$ can be controlled.

Color temperature of light which is emitted from the first light emitting units 5 of the light emitting device of Example 2 is set to 2700 K, and color temperature of light which is emitted from the second light emitting units 6 is set to 5000 K. Next, a relationship between a total (hereinafter, also referred to as a total forward current) size of a forward current flowing through the first wires $K_1$ and the second wires $K_2$ and color temperature of light which is emitted from the light emitting device was examined.

When the total forward current of 350 mA flowed, the color temperature of the light which was emitted from the entire light emitting device was 4000 K, and when the total forward current of 50 mA flowed, the color temperature of the light which was emitted from the entire light emitting device was 2700 K.

Example 3

In Example 3, a test was performed by using a light emitting device according to Example 3 having the same configuration as in FIG. 7 and FIG. 8 of Embodiment 3.

The configuration of the light emitting device according to Example 3 is basically the same as the configuration of the light emitting device according to Example 1. The light emission measure according to Example 3 is different from the configuration of Example 1 in that the low pass filter 54 including the capacitance member 12 and the resistor 4 is included in addition to the low pass filter 51 of Example 1. The resistors 3 and 4 are chip resistors with a resistance value of 10Ω. The capacitors 9 and 12 are chip capacitors with capacitance of 100 μF, in a case where a PWM frequency is set to 10 kHz.

Color temperature of light which is emitted from the first light emitting units 5 of the light emitting device of Example 3 is set to 2000 K, and color temperature of light which is emitted from the second light emitting units 6 is set to 4000 K. Next, a relationship between a total (hereinafter, also referred to as a total forward current) size of a forward current flowing through the first wires $K_1$ and the second wires $K_2$ and color temperature of light which is emitted from the light emitting device was examined.

When the total forward current of 350 mA flowed, the color temperature of the light which was emitted from the entire light emitting device was 3000 K, and when the total forward current of 50 mA flowed, the color temperature of the light which was emitted from the entire light emitting device was 2000 K.

With respect to noise reduction, the higher a frequency is, the smaller impedance of a capacitor is, and thus, noise components are reduced as the noise components flow from the capacitor side. In a case of Example 3, noise components are reduced to 1/1000 or less of noise components of Example 1. The values of the examples are only an example, and it is also possible to further reduce the noise components by adjusting a resistance value, capacitance, and inductance.

As described above, although the PWM signal type dimming circuit 15 is used, a smooth dimming toning light emitting device can be realized.

Example 4

In Example 4, a test was performed by using a light emitting device according to Embodiment 4 having the same configuration as in FIG. 9. The configuration of the light emitting device according to Example 2 is basically the same as the configuration of the light emitting device according to Example 1, and each member which is used is also the same as in Example 1. The light emitting device according to Example 4 is in a point that, when the light emitting device is viewed from an upper surface in a planar view, the first light emitting units 5 of a rectangular shape are formed at two locations, the second light emitting units 6 of a rectangular shape are formed at three locations, and an entire light emitting area has a rectangular shape.

Color temperature of light which is emitted from the first light emitting units 5 of the light emitting device of Example 5 is set to 2000 K, and color temperature of light which is emitted from the second light emitting units 6 is set to 3000 K. Next, a relationship between a total (hereinafter, also referred to as a total forward current) size of a forward current flowing through the first wires $K_1$ and the second wires $K_2$ and color temperature of light which is emitted from the light emitting device was examined.

When the total forward current of 350 mA flowed, the color temperature of the light which was emitted from the entire light emitting device was 2900 K, and when the total forward current of 50 mA flowed, the color temperature of the light which was emitted from the entire light emitting device was 2000 K.

By forming the light emitting unit as a rectangular shape, lighting of a straight tube type or the light emission suitable for the lighting device having a structure illustrated in FIG. 12 can be obtained.

In addition, by stereoscopically forming the light emitting units, light which is emitted from the light emitting device is distributed in all directions of the light emitting device, a light emitting device with excellent light distribution property can be obtained.

Furthermore, by using a structure in which two or more light emitting units of a rectangular shape are bonded together, light in which lights widely distributed in almost all circumferential directions are combined together can be obtained, and particularly, a structure which is optimal for a light source of an LED type light bulb can be realized.

It is considered that the embodiments and examples disclosed at this time are examples in all respects and are not restrictive. A scope of the present invention is indicated not by the aforementioned embodiments but by the scope of claims, and meaning equivalent to the scope of claims, and all changes within the scope are intended to be included.

REFERENCE SIGNS LIST 1,21,31,41,411,412,413,71 light emitting device
2,3,4 resistor
5 first light emitting unit
6 second light emitting unit
7 substrate
8 the LED element
9,12 capacitance member
10 resin dam
11 inductor
13 anode electrode land
14 cathode electrode land
15 PWM signal type dimming circuit
16 wiring pattern
17 light-transmitting resin
18 heat sink
19 reflector
20 wire
22 housing
23 front surface cover
24 G base
25,$K_3$ the conductive wires
51,52,53,54 low pass filter
60 first red phosphors
61 second red phosphors
70 green phosphors
50,80,81,82 lighting device
$K_1$ first wire
$K_2$ second wire

The invention claimed is:

1. A light emitting device comprising:
a pair of an anode electrode land and a cathode electrode land;
a first light emitting unit and a second light emitting unit which are electrically connected to the anode electrode land and the cathode electrode land, are adjacently provided in parallel with each other, and have a plurality of light emitting elements mounted therein; and
a low pass filter including a capacitance member which is provided in parallel with the first light emitting unit and the second light emitting unit, and a resistance member which is provided in series with the first light emitting unit, the second light emitting unit, and the capacitance member,
wherein electric resistance of the first light emitting unit is larger than electric resistance of the second light emitting unit, and
wherein color temperature of light which is emitted from an entire light emitting area including the first light emitting unit and the second light emitting unit is adjustable as power is supplied from a single power source,
wherein each of the first light emitting unit and the second light emitting unit includes an LED element which emits primary light with a peak wavelength of 430 to 480 nm, a light-transmitting resin, and a phosphor, and
wherein the phosphor which is included in the first light emitting unit and the second light emitting unit includes a red phosphor which is excited by the primary light that is emitted from the LED element and emits light with a peak light emission wavelength into a red region, and a green phosphor which is excited by the primary light that is emitted from the LED element and emits light with a peak light emission wavelength into a green region.

2. The light emitting device according to claim 1, wherein the resistance member comprises an inductor.

3. The light emitting device according to claim 1, wherein the light emitting device includes a plurality of low pass filters.

4. The light emitting device according to claim 1, wherein the first light emitting unit, the second light emitting unit, the capacitance member, and the low pass filter are disposed on the same substrate.

5. A lighting device comprising:
the light emitting device according to claim 1; and
a PWM signal type dimmer which is electrically connected to the light emitting device.

* * * * *